United States Patent [19]

Bernhoff et al.

[11] Patent Number: 6,140,715
[45] Date of Patent: Oct. 31, 2000

[54] ELECTRIC SWITCHING DEVICE AND A METHOD FOR PERFORMING ELECTRIC DISCONNECTION OF A LOAD

[75] Inventors: Hans Bernhoff; Jan Isberg, both of Västerås; Pan Min, Uppsala, all of Sweden

[73] Assignee: Asea Brown Boveri AB, Vasteras, Sweden

[21] Appl. No.: 09/187,047

[22] Filed: Nov. 6, 1998

[51] Int. Cl.[7] .................................................. H01L 29/00
[52] U.S. Cl. ........................................... 307/117; 257/119
[58] Field of Search .................................. 307/117, 125, 307/166; 361/9; 257/113, 119, 128

[56] References Cited

U.S. PATENT DOCUMENTS

| | | |
|---|---|---|
| 4,240,088 | 12/1980 | Myers . |
| 4,386,283 | 5/1983 | Roggwiller et al. . |
| 4,626,884 | 12/1986 | Shannon ..................................... 357/30 |
| 4,760,483 | 7/1988 | Kugelman et al. ........................ 361/13 |
| 4,779,126 | 10/1988 | Herman ..................................... 357/38 |
| 4,782,222 | 11/1988 | Ragle et al. . |
| 4,825,061 | 4/1989 | Schoenbach et al. .............. 250/211 R |
| 4,825,081 | 4/1989 | Wille et al. . |
| 5,002,034 | 3/1991 | Herden et al. ........................... 123/643 |
| 5,053,907 | 10/1991 | Nishi et al. .................................. 361/9 |
| 5,138,415 | 8/1992 | Yano .......................................... 357/30 |
| 5,283,706 | 2/1994 | Lillemo et al. .............................. 361/3 |
| 5,369,291 | 11/1994 | Swanson .................................. 257/128 |
| 5,452,170 | 9/1995 | Ohde et al. . |
| 5,525,828 | 6/1996 | Bassous et al. .......................... 257/457 |
| 5,663,580 | 9/1997 | Harris et al. . |
| 5,689,395 | 11/1997 | Duffy et al. . |
| 5,723,913 | 3/1998 | Weggel .................................... 307/125 |
| 5,790,354 | 8/1998 | Altiti et al. .................................. 361/8 |
| 5,920,065 | 7/1999 | Sun et al. .............................. 250/214.1 |
| 6,037,613 | 3/2000 | Mariyama ................................ 257/119 |

OTHER PUBLICATIONS

Triaros, Christos P. et al., "Photoconductive Switches for AC Circuit Protection", IEEE Transactions on Electron Devices, vol. 37, No. 12, Dec. 1990, pp. 2526–2531.

*Primary Examiner*—Stephen W. Jackson
*Assistant Examiner*—Rios Roberto
*Attorney, Agent, or Firm*—Pollock, Vande Sande & Amernick

[57] ABSTRACT

To provide for fast switching at high powers while relieving stress on a mechanical switch, an electric switching device comprising a mechanical electric switch and an irradiation source and at least one switching element sensitive to irradiation is adapted to create an electrically well conducting current path by-passing the mechanical switch upon irradiation of the switching element by the irradiation source. The switching element assumes an electrically insulating state in the absence of irradiation thereof. The switching element includes rectifiers adapted to be reverse biased when not irradiated and conducting as a consequence of generation of free charge carriers therein through irradiation by the irradiation source.

22 Claims, 2 Drawing Sheets

ELECTRIC SWITCHING DEVICE AND A METHOD FOR PERFORMING ELECTRIC DISCONNECTION OF A LOAD

BACKGROUND OF THE INVENTION

The present invention relates to an electric switching device comprising a quick mechanical electric switch. The device is primarily intended for disconnecting high powers, for example when overcurrents occur.

The invention also relates to a method for performing electric disconnection of a load, especially for disconnecting high electric powers.

The device may more exactly be intended for connecting and disconnecting objects in electric power plants or electric power networks as well connecting and disconnecting parts thereof to or from other equipment included in the electric power plant or an object connected thereto. Accordingly, the term "object" is intended to have a very broad sense and comprises any apparatuses and devices included in electric power plants and electric power networks as well as generally parts of the electric power plant and/or the electric power network.

It may, as an example, be as the object an electric apparatus having a magnetic circuit, for example a generator, transformer or motor. Also other objects are conceivable, for instance power lines and cables, switchgear equipment etc. The present invention is to be used for middle and high voltages. According to the IEC-standard middle voltage means 1–72,5 kV, while high voltage is >72,5 kV. Accordingly, the transmission, subtransmission and distribution levels are included.

In electric power plants known circuit breakers, for instance $SF_6$-breakers, oil breakers or so-called vacuum breakers, have normally been used for connection and disconnection of the object in question. In some rare cases, in which there is a requirement of a very high speed, semiconductor "breakers", such as for example thyristors or IGBTs, may be used.

All circuit breakers have such a design that they, when breaking, give rise to a galvanic separation of two metal contacts (arcing contacts), between which the current to be interrupted continues to flow in an arc. The interruption or breaking is then achieved by arranging the breaker so that this arc is extinguished upon a zero passage, i.e. when the current through the breaker arrives at zero and changes polarity, which takes place two times each twenty milliseconds in a 50 Hz-network. Accordingly, these circuit breakers only function for alternating current and not for direct current, where no zero passage occurs.

A circuit breaker with the construction according to above has to be designed for being able to interrupt both in a large amount of breaking cases with comparatively moderate currents, so-called operation currents, but also in breaking cases with a high over-current, fault currents.

A circuit breaker has to be designed to handle large amounts of energy when breaking an overcurrent in the arc between the arcing contacts. The gap between the contacts has to be brought to a very high dielectric strength within a short period of time after a current breaking has been successfully carried out so as to avoid reignition of an arc, i.e. guarantee the continued existence of the breaking.

Since circuit breakers, for example a $SF_6$-breakers, oil breakers or so-called vacuum breakers, have to handle high thermal and electric load in one and the same critical region within a short period of time, they will have a comparatively complex construction, which results in a comparatively long breaking time.

It is underlined that the overcurrent primarily intended here is a short-circuit current generated in connection to the object switched, for example as a consequence of a fault in the electric insulation system of the object switched. Such faults mean that the fault current (short-circuit current) of external network/equipment will tend to flow through an arc. The result of this may be a very large breakdown. It may also be mentioned that the short-circuit current (fault current) dimensioned for the Swedish power network is 63 kA. The short-circuit current may in the reality be 40–50 kA.

A problem with such circuit breakers is the long breaking time thereof. The breaking time dimensioning (IEC-standard) for a breaking completely carried out is 150 milliseconds (ms). Large difficulties are associated with reducing this breaking time to under 90–130 ms depending on the operation case. As a consequence, a very high current will flow through the object switched upon a fault therein during the entire time required for bringing the circuit breaker to break. The total fault current of the external power network place considerable stress on the object switched during this time. The operation of the network will also be disturbed during this time; so that other equipment connected to the network may be substantially disturbed or damaged. In order to avoid damages and total breakdowns with respect to the object switched, the object is constructed so that it may manage to be subject to the short-circuit currents/fault currents during the breaking time of the circuit breaker with negligible damages. The need to construct the object switched so that it may take the short-circuit current/fault current during a considerable time results in substantial drawbacks in the form of more expensive constructions and lower performances. With respect to disturbances of the network and equipment connected thereto there is at present no protection integrated in the network, so that each manufacturer has to protect sensitive equipment with "backup" and network stabilizing assemblies. More sensitive equipment such as systems based on microprocessors, for example communication and computer systems, frequently requires a restart associated with considerable costs.

Semiconductor power devices, such as thyristors, MOSFETs and IGBTS, may not, alone, handle the voltages in question, so that a number thereof have to be connected in series. Hundreds of such components have to be connected in series in some high voltage applications. This leads to a complicated control of the equipment for ensuring the operation, i.e. that the voltage and power is distributed uniformly over the components. The use of semiconductor components made of silicon also results in comparatively high losses, which requires an efficient cooling, since the component may otherwise break down thermally. The total system with control, regulation and cooling all the components connected in series individually on the individual voltage level thereof tends to become very complex and the entire system is therefore associated with high costs. The costs may exceed those for circuit breakers considerably, which in general excludes the use of such semiconductor components in electric power plants and electric power networks for the application discussed here.

SUMMARY OF THE INVENTION

The object of the present invention is to provide a device and a method making it possible to obtain a better switching and by that a reduced stress on the object switched and also a reduced disturbance of the network and reduced equipment costs.

This object according to the invention, is obtained by providing a device comprising a first mechanical electric switch wherein a second electric switch is designed so that a switching element, which hereinafter is a shunt element, is connected in parallel with the first electric switch which has metal contacts. The shunt element is so designed that it may be brought into an electrically conducting state through irradiation, for example by light or an electron beam. When a disconnection, i.e. a breaking, is carried out, the shunt element is exposed to irradiation, which brings the shunt element into a conducting state and the mechanical switch is controlled to disconnect without any thermal or electric load. The exposure of the shunt element to irradiation is preferably ceased when the breaker is in a separated position, which means that this element loses its electrical conductivity.

By using a rectifying means adapted to be reverse biased when not irradiated and conducting as a consequence of generation of free charge carriers therein through irradiation by a cource as a switching element, the switching element may be very rapidly controlled to conduct in exactly the period of time desired when disconnecting an object from an electric power network or the like, and the switching element will immediately stop conducting when not irradiated any longer by the fact that it will then be reverse biased. There are also considerable advantages with respect to the prior art devices when the device is brought into the conducting state, in which the rectifying means is irradiated, so that the mechanical electric switch may close without any transients.

Thus, the invention is based on the principle that a mechanical operation for opening and closing a circuit is not solely relied upon, and that conventional power semiconductor components are not used, avoiding with the high costs and the high losses associated therewith. Rather, a switching device comprising a mechanical electric switch and a shunt element, the conductivity of which is controlled by irradiation, is instead utilized. This method of releasing the mechanical contact from electric thermal stress during its operation means that the breaker may be constructed so that a very quick breaking is obtained.

According to a preferred embodiment of the invention the rectifying means is a rectifying diode. The use of a reverse biased diode in the second electric switch in a switching device of this type is advantageous, since it may be easily and reliably controlled to conduct by irradiation thereof when desired and also efficiently hold the voltages required when in the blocking state. Furthermore, such diodes are widely available on the market and may be purchased to a considerably low cost. It is taught by P. Roggwiler and R. Sittig in CH 1616-2/80/0000-0646 500.75, 1980 IEEE, to use a photoconductive diode being reverse biased and connected in anti-parallel with a thyristor to turn the thyristor off by making the diode being reverse biased conducting through irradiation of the diode and thereby creating free minority charge carriers therein. If the period of time of the conducting of the diode lasts long enough, the thyristor switches off. However, the present inventors propose a new use of such a rectifying diode, namely in an electric switching device having a quick mechanical electric switch for taking care of an essential part of the current through the switching device when the mechanical electric switch is disconnecting for enabling a much faster breaking of an electric current through the electric switching device, especially for high electric powers, than the prior art devices allow.

The diode may be of any conceivable type, which may be controlled by irradiation thereof, and it is according to different preferred embodiments a pn-diode, a pin-diode and a schottky-diode, respectively. Such diodes are available on the market at a cost being low in this context.

According to preferred embodiments of the invention the rectifying means has at least one layer made of SiC and at least one layer made of diamond, respectively. Such rectifying means, such as diodes, made of SiC or diamond, will, due to the characteristics of these materials, be very advantageous in an electric switching device of this type. These two materials have both a very high breakdown voltage, so that such a rectifying means may hold a considerably higher voltage in the blocking state thereof than such rectifying means made of semiconductor materials conventionally used. This means that fewer, including as few as one, such rectifying means may hold a voltage which would normally require a plurality of rectifying means of conventional materials connected in series for holding very high voltages. Furthermore, both SiC and diamond are stable at very high temperatures, well up to 1,000° K, which may be very useful when high electric powers are to be handled.

According to another preferred embodiment of the invention the rectifying means is a photoconductive element. This constitutes an easy way to control the rectifying means.

According to another preferred embodiment of the invention the second electric switch comprises a plurality of the rectifying means connected in series, which means that the device may function well when breaking very high voltages.

According to another preferred embodiment of the invention, which constitutes a further development of the above-described embodiment, at least two of the rectifying means of a plurality of rectifying means are connected to be reverse biased in opposite directions, so that at least one is forward biased when another is reverse biased. It is emphasized that this embodiment also comprises the case that the plurality is only two, and that the device then only has two rectifying means oppositely connected. An electric switching device of this type may be used for breaking alternating currents very rapidly, since it will always have at least one of the rectifying means reverse biased, and this may then be controlled by irradiation thereof to conduct, so that the second electric switch may take care of the major part of the current through the device when this is desired. It is then of course necessary that all the rectifying means being reverse biased, when there are more than one, are irradiated simultaneously, so that the switching element may assume a conducting state, this is also stated in a further preferred embodiment of the invention, in which a source is adapted to simultaneously irradiate all rectifying means reverse biased when it irradiates.

According to another preferred embodiment of the invention the device comprises a plurality of quick mechanical electric switches connected in series and having each a second electric switch connected in parallel therewith. Such a device may be used for handling very high electric powers, and the quick mechanical electric switches will then advantageously be controlled simultaneously, as well as the second electric switches of the device.

According to another preferred embodiment of the invention the switching element has a member comprising three superimposed semiconductor layers, in which the two outermost are doped according to a first conductivity type, n or p, and the intermediate layer is doped according to a second conductivity type resulting in two pn-junctions oppositely directed for forming two rectifying means connected in series and reverse biased in opposite directions to each other by one and the same member. Such a switching element is advantageous for rapidly breaking alternating currents irrespectively of the instantaneous phase position of the alternating voltage.

According to another preferred embodiment of the invention a switching element is formed by a plurality of pin-diodes formed by an intermediate intrinsic bulk layer and islands of p-doped layers arranged on one—the of said intermediate layer, and islands of n-doped layers located on the opposite side of the intermediate layer and substantially covering the space between two adjacent p-type layers, for forming a cascade of pin-diodes forming a continuous current path running alternatingly from one p-type layer to a n-type layer and from the n-type layer to another p-type layer. This results in two succeeding diodes directed in opposite directions. Such a switching element may switch very high voltages and it may, due to the "bipolar" structure thereof, be used in electric switching devices where alternating voltages are to be switched very rapidly.

According to another preferred embodiment of the invention at least one varistor is connected in parallel with the first electric switch and the switching element. Overvoltages which would be generated when breaking an inductive load induce a current in the varistor, in which the magnetic energy is absorbed. Accordingly, the varistor is used to absorb magnetic energy possibly stored in the electric switching device.

According to another preferred embodiment of the invention an electric switching device according to any embodiment of the invention mentioned above is used for connecting and disconnecting objects in an electric power plant to and from, respectively, an electric power network or another other equipment included in the electric power plant. This is an advantageous use of an electric switching device of this type, since the problems of rapidly connecting and disconnecting objects are particularly accentuated there.

The invention also comprises a method for performing electric disconnection of a load, especially for disconnecting high electric powers, by means of a quick mechanical electric switch, in which a second electric switch connected in parallel with the first mechanical electric switch, and comprising any radiation source and a switching element sensitive to irradiation, is used to form an electrically well conducting current path by-passing the first electric switch through irradiation of the switching element by the irradiation source, so that the switching element is brought from an electrically insulating state to an electrically conducting state and the first electric switch is disconnected to interruption. This is an advantageous way of performing electric disconnection of a load, since this may be achieved very rapidly for the reasons mentioned above.

Further advantages and preferred features of the invention appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF THE PREFERRED EMBODIMENT(S)

Figure 1:
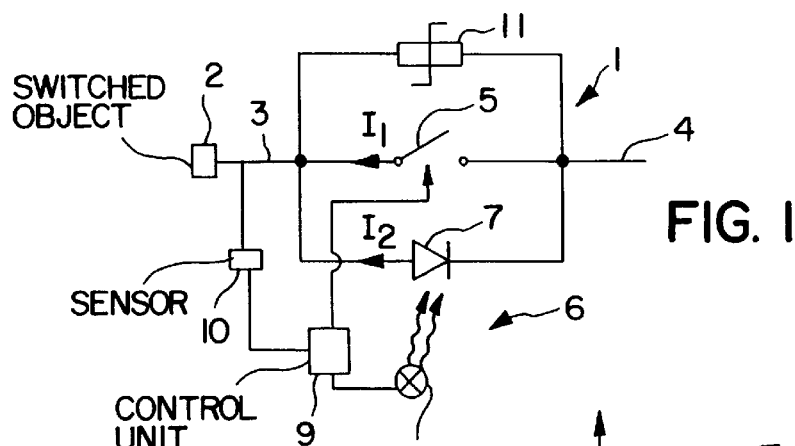
FIG. 1 is a schematic view illustrating the most essential parts of an electric switching device according to a first preferred embodiment of the invention.

An electric switching device 1 according to a first preferred embodiment of the invention is schematically illustrated in FIG. 1. This device is arranged in an electric power plant having a switched object 2, such as a generator. This object is connected to an external electric power supply network 4 through a line 3. The electric switching device is arranged to switch the object, i.e. connect and disconnect the object 2 and the power network 4. However, it is emphasized that switching of the object may take place with respect to any other part of the electric power plant. The disconnection of the object 2 with respect to the network may either take place for protecting the object against fault currents from the network or the equipment, or for protecting the network/equipment against voltage and operation disturbances that would result from a high fault current towards the object.

The switching device comprises a first electric switch 5 in the form of a quick mechanical switch, which may be a disconnector or a breaker, having two contacts controlled to move apart for breaking and into contact with each other for closing the switch. A second electric switch 6 is connected in parallel with the first switch 5 and comprises a switching element in the form of a photoconductive diode 7 arranged to be reverse biased when the object 2 is connected to the network 4, which in this case is a direct current network. The second electric switch also comprises an irradiation source 8 adapted to irradiate the diode 7 for generating free charge carriers therein and bringing it into a conducting state as long as it is irradiated. Thus, the switching element is controlled by means, the irradiation source, electrically separated from the element.

Furthermore, the device has also a control unit 9 adapted to control the light source 8 and the mechanical switch 5. This unit is connected to a sensor 10 adapted to detect parameters indicating the presence of an overcurrent in the line 3.

A varistor 11 is connected in parallel with the mechanical switch 5, and the function thereof will be explained further below.

The electric switching device is very fast with respect to a conventional circuit breaker, which means that a fault current in the line 3 will not rise to the maximum level.

Figure 2:
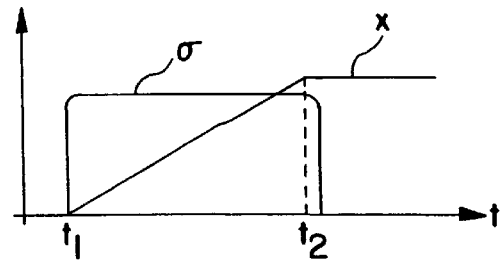
FIG. 2 is a diagram illustrating the distance x between two contacts in a mechanical electric switch in the electric switching device according to FIG. 1 and the electric conductivity of the photoconductive diode in the device versus time when the electric switching device disconnects a load.
Figure 3:
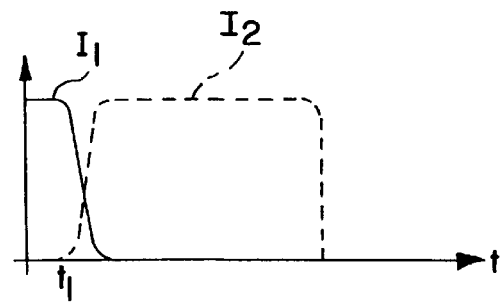
FIG. 3 is a diagram illustrating the current $I_1$ through the mechanical electric switch and the current $I_2$ through the photoconductive diode of the device according to FIG. 1 versus time when disconnecting a load.

FIGS. 2 and 3 illustrates what is happening when an overcurrent has been detected by the sensor 10 and the control unit 9 controls the switching device to disconnect the object 2 from the network/equipment 4. At a point of time $t_1$ corresponding to the point of time for the detection of an overcurrent the mechanical switch is controlled to start to separate the contacts, and these move apart according to the line x in FIG. 2 indicating the distance between the two contacts. The light source 8 is at the same time controlled to start to irradiate the diode 7, so that the electrical conductivity thereof is changed according to the line σ in FIG. 2. This means that the contact gap resulting when the mechanical switch 5 is controlled to disconnect is not subject to any substantial electric or thermal stress during the operation of the mechanical switch. The electric interruption of the current path is instead taking place in the diode 7 (shunt element), in which magnetic energy possibly remaining is absorbed in the varistor 11. Thus, conditions for breaking a fault current very rapidly are so created. The source 8 will radiate the diode 7 to a point of time $t_2$, at which the contacts of the mechanical switch 5 have reached the position maximally spaced apart, and when the radiation of a diode is stopped the mechanical switch 5 will be able to complete and maintain the electrical insulation between the object 2 and the network/equipment 4.

It is illustrated in FIG. 3 how the current $I_1$ through the mechanical switch falls as of the point of time $t_1$ for the start of the disconnecting procedure and how the current $I_2$ through the diode 7 starts to flow from $t_1$ until $t_2$.

When the object 2 is to be switched in, i.e. connected to the network/equipment 4, again, the electric switching device is brought into the conducting state by controlling the source 8 through the control unit 9 to irradiate the diode 7, whereby the mechanical switch will close without any transients.

Figure 4:
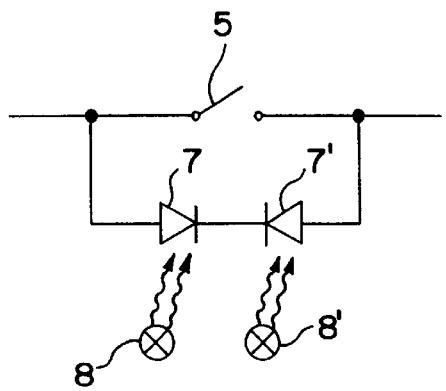
FIG. 4 is a schematic view of a part of an electric switching device according to a second preferred embodiment of the invention.

A part of an electric switching device according to a second preferred embodiment of the invention is schematically illustrated in FIG. 4, and this differs from that shown in FIG. 1 by the fact that the switching element 6 has two rectifying diodes 7, 7' connected in series so that they will be reverse biased in opposite directions. An irradiation source 8, 8' is arranged for each diode. This device is adapted to switch alternating voltages, since one of the diodes will always be reverse biased and when not irradiated, will be in the blocking state. When an overcurrent has been detected and the contacts of the mechanical switch 5 are separated, the radiation source associated with the diode being reverse biased at that moment will start to irradiate the diode for carrying out the same disconnecting procedure as illustrated in FIGS. 2 and 3 for the direct voltage case.

Figure 5:
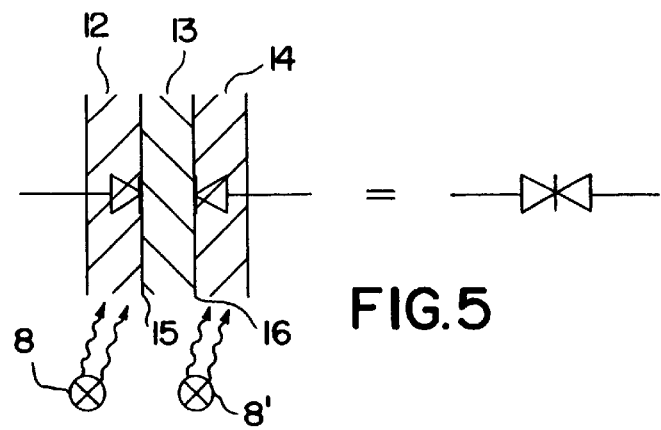
FIG. 5 is a schematic cross-section view of a switching element for an electric switching device according to the invention.

FIG. 5 illustrates how a switching element for the alternating voltage case may be constructed by a pnp- or npn-structure of superimposed semiconductor layers 12–14. The outermost layers 12, 14 are doped according to the same conductivity type, n or p, whereas the intermediate layer 13 is doped according to the opposite conductivity type. This means that pn-junctions are formed at the interfaces 15, 16 between the layers, and one of these junctions will be reverse biased, whereas the other will be forward biased depending upon the direction of the voltage across this semiconductor component. Two light sources 8, 8' are arranged for obtaining the same function of this component as of the two diodes 7, 7' according to FIG. 4. Accordingly, irradiation of for instance the layer 12, when the pn-junction 15 is reverse biased will generate minority charge carriers therein for conduction through this junction.

Figure 6:
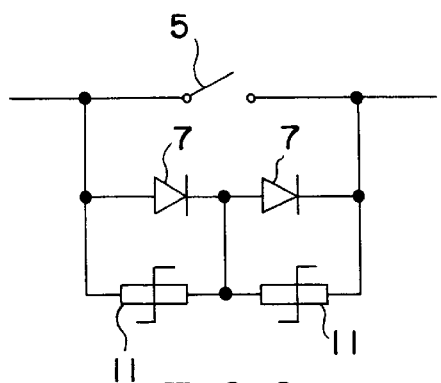
FIG. 6 is a schematic view of a electric switching device according to a third embodiment of the present invention.

FIG. 6 illustrates an electric switching device which is an alternative to that shown in FIG. 1 for the direct voltage case. It is illustrated how two rectifying means in the form of diodes are connected in series across the mechanical switch 5 for being able to hold higher voltages when needed.

A varistor 11 is connected across each diode for absorbing magnetic energy and for ensuring that the two diodes 7, 7' will share the power and the voltage developed upon disconnecting equally. It should be mentioned, that a disconnector may be arranged between the switching element 6 and the network/equipment 4 and be controlled to disconnect the network/equipment 4 from the diode/diodes after the disconnection of the object 2 from the network/equipment for taking the voltage away from the diodes in the disconnected state.

Figure 7:
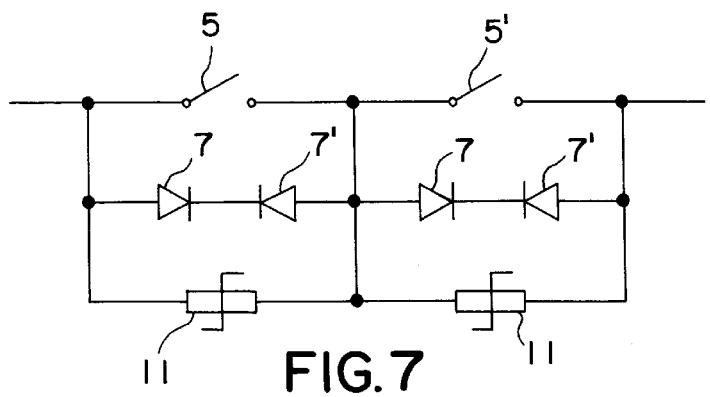
FIG. 7 is a schematic view of an electric switching device according to a fourth embodiment.

A further preferred embodiment of the invention is shown in FIG. 7, which constitutes a combination of the embodiment shown in FIG. 6 and that of FIG. 4. In this case two mechanical electric switches 5, 5' are connected in series, and two oppositely directed diodes 7, 7' are connected across each mechanical switch. Accordingly, this device is suitable for breaking alternating currents, and the series connection of the mechanical switches makes it possible to handle higher voltages.

Figure 8:
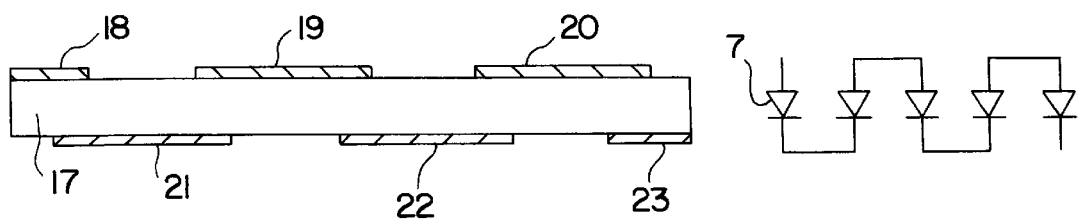
FIG. 8 is a schematic view of a switching element for an electric switching device according to the invention.

FIG. 8 illustrates a preferred way to create many rectifying means connected in series for the use as a switching element in an electric switching device for switching alternating voltages. This switching element 6 is constituted by a cascade of pin-diodes, which are integrated in the same semiconductor wafer. A cascade of a great number of diodes, for instance 10–40, may easily be manufactured by etching from one single "semi-insulating-wafer" 17, the upper side of which has been doped according to a first conductivity type, such as p, or coated by a layer of this conductivity type and the lower side of which has been doped according to the opposite conductivity type, such as n. Accordingly, the layers 18–20 may be p-doped, and the layers 21–23 may be n-doped. The layer 17 is substantially undoped. It is shown to the right in FIG. 8 how a number of diodes are created in this way. Thus, if each element (diode) may switch 1 kV the cascade may switch substantially higher voltages, for instance 20 kV for 40 diodes in series. A structure of this type functions as a conventional photoconductive switch, i.e. is conducting when it is irradiated and insulating when not irradiated. The switching performances of the individual diodes depends upon the material used, the thickness of the layer 17 and the doping profiles, and it may be mentioned that the use of SiC or intrinsic diamond for the layer 17 will result in diodes able to hold much higher voltages, perhaps in the region of 10 kV or higher each.

The invention is of course not in any way restricted to the preferred embodiments described above, but many possibilities to modifications thereof would be apparent to a man with ordinary skill in the art without departing from the basic idea of the invention as defined in the appended claims.

The number of rectifying means, mechanical switches and the like may of course be arbitrarily varied.

The irradiation source may be of any type utilizing for instance visible light, UV-light, IR-light, electron beams, ion beams, x-ray radiation and so on.

What is claimed is:

1. An electric switching device comprising
   a first electric switch;
   a second electric switch connected in parallel with said first electric switch, said second electric switch including:
      an irradiation source; and
      a switching element comprising a plurality of rectifying means connected in series;
   wherein:
      said rectifying means are adapted to be reverse-biased to assume an electrically insulating state when not irradiated by said irradiation source, and when irradiated by said irradiation source, conducting to create an electrical current path which bypasses said first electric switch;

at least two of said plurality of rectifying means are connected to be biased in opposite directions, so that at least one is forward-biased when another is reverse-biased; and said plurality of rectifying means is formed by a plurality of pin-diodes formed by an intermediate intrinsic bulk layer and islands of p-doped layers arranged on one side of said intermediate layer, and islands of n-doped layers located on the opposite side of the intermediate layer and substantially covering the space between the two adjacent p-type layers, for forming a cascade of pin-diodes forming a continuous current path running alternatingly from one p-type layer to a n-type layer and from said n-type layer to another p-type layer, whereby said at least two oppositely-biased diodes are implemented.

2. A device according to claim 1, wherein said rectifying means has at least one layer made of Si.

3. A device according to claim 1, wherein said rectifying means has at least one layer made of SiC.

4. A device according to claim 1, wherein said rectifying means has at least one layer made of diamond.

5. A device according to claim 1, wherein said rectifying means (7, 7') is a photoconductive element.

6. A device according to claim 1, wherein said irradiation source is adapted to simultaneously irradiate all rectifying means reverse biased when it irradiates.

7. A device according to claim 1, further comprising a plurality of said first electric switches connected in series, each having a second electric switch connected in parallel therewith.

8. A device according to claim 1 wherein, characterized in said quick mechanical electric switch (5, 5') is a disconnecting switch.

9. A device according to claim 1, wherein at least one means for absorbing magnetic energy possibly generated upon disconnection of the device is connected in parallel with the first electric switch and the switching element.

10. A device according to claim 9, characterized in that said means for absorbing magnetic energy is a varistor (11).

11. A device according to claim 1 wherein, the at least one switching element and the irradiation source are electrically separated from each other.

12. A device according to claim 1, wherein a control unit is connected to the first and second electric switches so as to control the function thereof depending upon information arriving to the control unit.

13. A device according to claim 12 wherein an arrangement detecting overcurrent conditions is connected to the control unit so as to deliver information thereto about conditions indicating overcurrents.

14. A device according to claim 12 wherein, the control unit is adapted, when disconnecting, to first control the second electric switch to form the electrical current path through irradiation of the switching element and after that control the first electric switch to disconnect.

15. A device according to claim 1, wherein said device is arranged to connect and disconnect objects to and from, respectively, an electric power network in an electric power plant or other equipment included in the electric power plant, said first and second electric switches being connected in a line between the object and the network or other equipment.

16. A device according to claim 1, wherein said device is adapted for use for voltages within a range including one kilovolt and 5 kV.

17. A method comprising the steps of:

providing an electric switching device comprising:
a first electric switch;
a second electric switch connected in parallel with said first electric switch,
said second electric switch including:
an irradiation source; and
a switching element comprising a plurality of rectifying means connected in series;
wherein:
said rectifying means are adapted to be reverse-biased to assume an electrically insulating state when not irradiated by said irradiation source, and when irradiated by said irradiation source, conducting to create an electrical current path which bypasses said first electric switch;
at least two of said plurality of rectifying means are connected to be biased in opposite directions, so that at least one is forward-biased when another is reverse-biased; and
said plurality of rectifying means is formed by a plurality of pin-diodes formed by an intermediate intrinsic bulk layer and islands of p-doped layers arranged on one side of said intermediate layer, and islands of n-doped layers located on the opposite side of the intermediate layer and substantially covering the space between the two adjacent p-type layers, for forming a cascade of pin-diodes forming a continuous current path running alternatingly from one p-type layer to a n-type layer and from said n-type layer to another p-type layer, whereby said at least two oppositely-biased diodes are implemented; and
operating said electric switch device to connect and disconnect a load from an electric power network.

18. A device according to claim 1, wherein said device is adapted for use for voltages within a range above 5 kV and including 10 kV.

19. A device according to claim 1, wherein said device is adapted for use for voltages within a range above 10 kV and including 20 kV.

20. A device according to claim 1, wherein said device is adapted for use for voltages within a range above 20 kV and including 40 kV.

21. A device according to claim 1, wherein said device is adapted for use for voltages within a range above 40 kV and including 72 kV.

22. A device according to claim 1, wherein said device is adapted for use for voltages above 72 kV.

* * * * *